(12) United States Patent  (10) Patent No.: US 8,269,563 B2
Ballantyne  (45) Date of Patent: Sep. 18, 2012

(54) DITHERING A DIGITALLY-CONTROLLED OSCILLATOR OUTPUT IN A PHASE-LOCKED LOOP

(75) Inventor: Gary John Ballantyne, Christchurch (NZ)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 12/136,690

(22) Filed: Jun. 10, 2008

(65) Prior Publication Data

US 2009/0302951 A1 Dec. 10, 2009

(51) Int. Cl.
*H03L 7/085* (2006.01)
*H03L 7/089* (2006.01)
*H03L 7/099* (2006.01)

(52) U.S. Cl. ........... 331/1 A; 331/16; 331/34; 331/36 R; 331/36 C; 331/117 R; 331/177 V

(58) Field of Classification Search .............. 331/1 A, 331/16, 34, 36 R, 36 C, 177 R, 177 V
See application file for complete search history.

(56) References Cited

U.S. PATENT DOCUMENTS

| 5,118,975 | A * | 6/1992 | Hillis et al. | 327/158 |
|---|---|---|---|---|
| 5,426,392 | A * | 6/1995 | Kornfeld | 327/551 |
| 6,501,307 | B1 * | 12/2002 | Yen | 327/113 |
| 6,995,621 | B1 * | 2/2006 | Culler | 331/57 |
| 7,046,098 | B2 * | 5/2006 | Staszewski | 331/158 |
| 2002/0033737 | A1 * | 3/2002 | Staszewski et al. | 331/17 |
| 2006/0103566 | A1 * | 5/2006 | Vemulapalli et al. | 341/155 |
| 2008/0205571 | A1 * | 8/2008 | Muhammad et al. | 375/376 |
| 2009/0195278 | A1 * | 8/2009 | Friedman et al. | 327/159 |

FOREIGN PATENT DOCUMENTS

| EP | 1255355 A1 | 11/2002 |
|---|---|---|
| JP | 897714 | 4/1996 |
| JP | 2000082954 A | 3/2000 |
| JP | 2002033660 A | 1/2002 |
| JP | 2009010599 A | 1/2009 |
| JP | 2009171460 A | 7/2009 |

OTHER PUBLICATIONS

Baronti F et al: "A technique for nonlinearity self-calibration of DLLs" IEEE Transactions on Instrumentation and Measurement, IEEE Service Center, PI Scataway, NJ, US, vol. 52, No. 4, Aug. 1, 2003, pp. 1255-1260, XP011101118 ISSN: 0018-9456 p. 1256, paragraph I I ; figure 2.
International Search Report and Written Opinion—PCT/US2009/046643, International Search Authority—European Patent Office—Nov. 27, 2009.

* cited by examiner

*Primary Examiner* — Robert Pascal
*Assistant Examiner* — Richard Tan
(74) *Attorney, Agent, or Firm* — Jonathan Velasco; S. Hossain Beladi

(57) ABSTRACT

A digitally-controlled oscillator (DCO) of a PLL is dithered such that a DCO_OUT signal has a frequency that changes at dithered intervals. In one example, the DCO receives an undithered stream of incoming digital tuning words, and receives a dithered reference clock signal REFD, and outputs the DCO_OUT signal such that its frequency changes occur at dithered intervals. Where the PLL is employed in the local oscillator of a cellular telephone transmitter, the novel dithering of the DCO spreads digital image noise out in frequency such that less digital image noise is present at a particular frequency offset from the main local oscillator frequency. Spreading digital image noise out in frequency allows a noise specification to be met without having to increase the frequency of the PLL reference clock. By avoiding increasing the frequency of the reference clock to meet the noise specification, increases in power consumption are avoided.

12 Claims, 7 Drawing Sheets

DITHERING A DIGITALLY-CONTROLLED OSCILLATOR OUTPUT IN A PHASE-LOCKED LOOP

BACKGROUND INFORMATION

1. Technical Field

The disclosed embodiments relate to all-digital phase-locked loops (ADPLLs).

2. Background Information

FIG. 1 (Prior Art) is a block diagram of one example of a type of all-digital phase-locked loop (ADPLL) called a time-to-digital converter (TDC) PLL 1. Such a TDC PLL may, for example, be used to generate a local oscillator signal LO in the local oscillator of the transmitter of a cellular telephone. TDC PLL 1 involves a loop filter 2 that outputs a stream of multi-bit digital tuning words. A Digitally Controlled Oscillator (DCO) 3 receives a digital tuning word and outputs a corresponding signal DCO_OUT whose frequency is determined by the digital tuning word. DCO 3 may, for example, receive a reference clock signal REF such that it changes the frequency of DCO_OUT synchronously with respect to clock signal REF. An accumulator 4 increments each period of DCO_OUT, and the value of the accumulator is latched into latch 5 synchronously with the reference clock signal REF. A reference phase accumulator 6 increments by the value on its input leads 7. Reference phase accumulator 6 also increments synchronously with the reference clock signal REF. The value accumulated in accumulator 6 is supplied via lines 8 to a subtractor 9. The output of an adder 10 is supplied via lines 11 to subtractor 9. Subtractor 9, which is also referred to as a phase detector, subtracts the value on lines 11 from the value on lines 8 and supplies the resulting error value in the form of a digital word onto lines 12 and to loop filter 2.

The value on input leads 7 by which accumulator 6 increments is the sum of a modulation frequency control value on lines 13, a channel frequency control integer value on lines 14, and a channel frequency control fractional value on lines 15. The fractional value 15 is changed over time by a delta-sigma modulator 21. In this particular example, two point modulation is used so the modulation frequency control value on lines 13 is scaled by block 19 and is injected into the control loop at a second modulation point at adder 20. The value on lines 11 is the sum of an integer portion output by latch 5 as well as a fractional portion on lines 16. A time-to-digital converter 17 produces a digital output timestamp representing the time difference between an edge of the signal DCO_OUT and an edge of the reference clock signal REF. The reference clock signal REF in this example has a fixed, but significantly lower frequency than DCO_OUT. The timestamps output by TDC 17 are normalized by a normalization circuit 18 to generate the fractional portion on lines 16. The control loop operates to keep the values on lines 8 and 11 locked to one another and substantially identical.

Although the conventional ADPLL of FIG. 1 works well in the cellular telephone transmitter application, the frequency of the signal DCO_OUT changes at discrete times. These discrete times are equally spaced in time. This introduces what is known at as a "digital images". These digital images are spectral components of the local oscillator output signal LO that are not at the desired LO main frequency. As the frequency of the reference clock REF increases, the digital images move farther away in frequency from the LO main frequency, and the digital images get smaller in power. Increasing the frequency of the reference clock REF therefore reduces the digital image noise problem. For most cellular telephone protocols, there is a specification that sets the maximum allowed noise allowed outside the channel in which the cellular telephone is transmitting. For GSM (Global System for Mobile Communications) applications, for example, it is generally necessary to increase the frequency of REF to be higher than about 40 megahertz so that the digital images are of low enough magnitude. Increasing the frequency of the reference clock REF, however, increases the amount of switching in the PLL circuitry and therefore increases power consumption.

SUMMARY

A digitally-controlled oscillator (DCO) of a phase-locked loop (PLL) is dithered such that a DCO_OUT signal output by the DCO has a frequency that changes at dithered intervals. The frequency of DCO_OUT may change at substantially discrete times, but these times are dithered so that there is not a single constant and fixed time interval between successive ones of the times at which the frequency of DCO_OUT is changed. In one example, the DCO receives an undithered stream of incoming digital tuning words, and receives a dithered reference clock signal REFD, and outputs the DCO_OUT signal such that its frequency changes at dithered intervals. Where the PLL is employed in the local oscillator of a cellular telephone transmitter, the novel dithering of the DCO may be used to spread digital image noise out over frequency such that less digital image noise is present at a particular frequency offset from the main local oscillator frequency. Spreading digital image noise out in frequency in this fashion allows cellular telephone noise specifications to be met without having to increase the frequency of the PLL reference clock. By avoiding increasing the frequency of the reference clock to meet noise specifications, increases in power consumption are avoided.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 2:
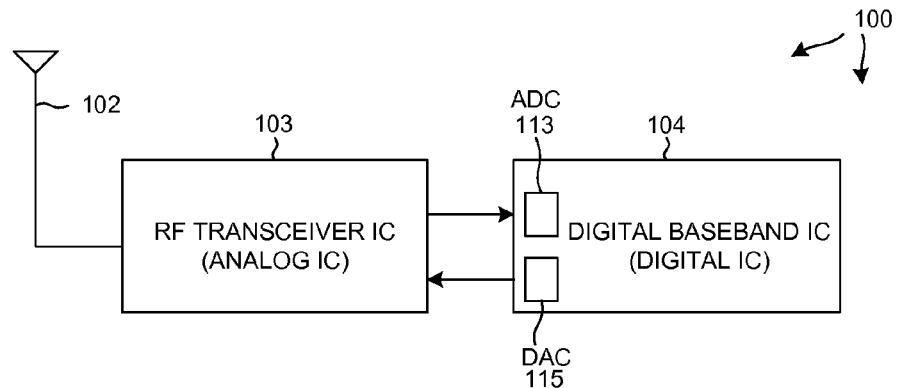
FIG. 2 is a high level block diagram of one particular type of mobile communication device 100 in accordance with one novel aspect.

FIG. 2 is a very simplified high level block diagram of one particular type of mobile communication device 100 in accordance with one novel aspect. In this particular example, mobile communication device 100 is a 3G cellular telephone capable of operating in accordance with either a Code Division Multiple Access (CDMA) cellular telephone communication protocol or a GSM (Global System for Mobile Communications) cellular telephone communication protocol. The cellular telephone includes (among several other parts not illustrated) an antenna 102 and two integrated circuits 103 and 104. Integrated circuit 104 is called a "digital baseband integrated circuit" or a "baseband processor integrated circuit". Integrated circuit 103 is an RF transceiver integrated circuit. RF transceiver integrated circuit 103 is called a "transceiver" because it includes a transmitter as well as a receiver.

Figure 3:
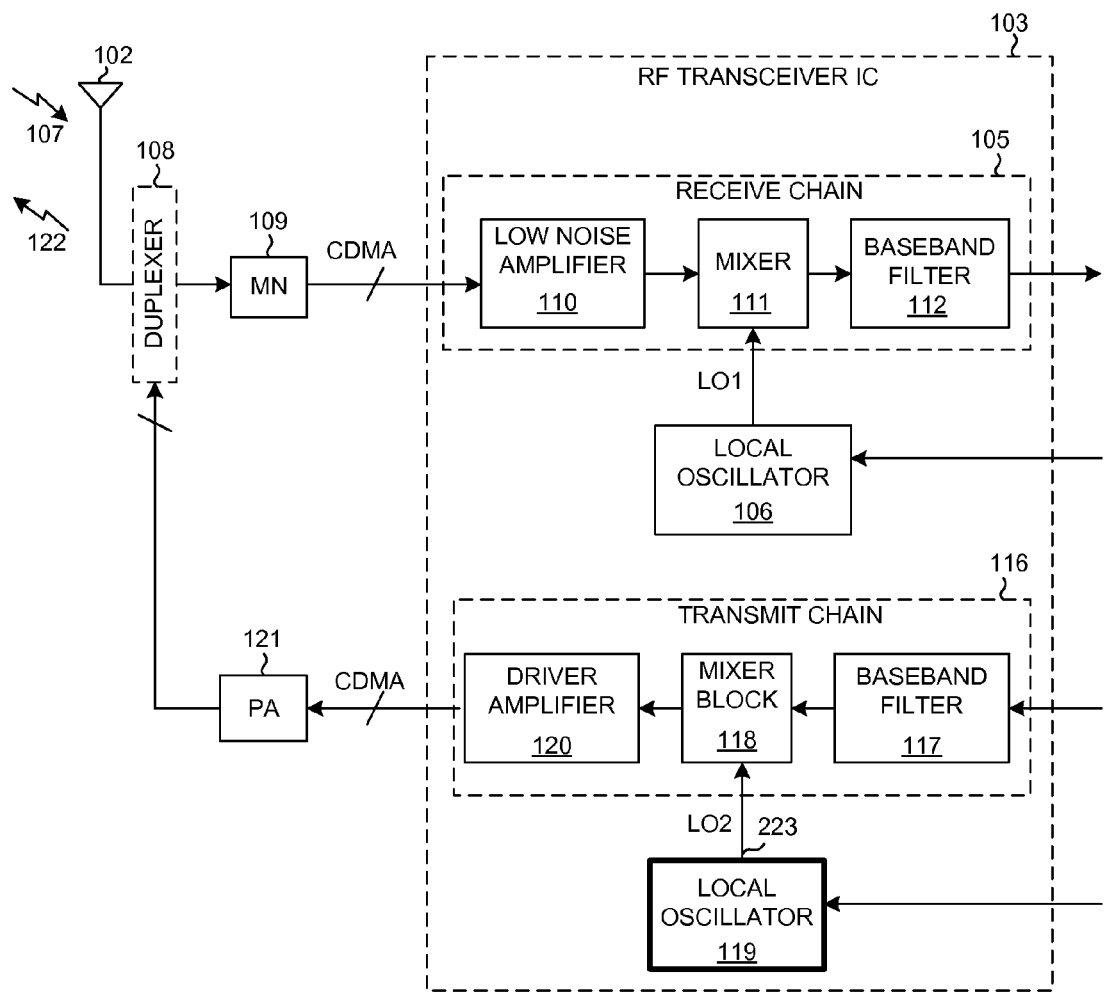
FIG. 3 is a more detailed block diagram of the RF transceiver integrated circuit 103 of FIG. 2.

FIG. 3 is a more detailed block diagram of the RF transceiver integrated circuit 103 of FIG. 2. The receiver includes what is called a "receive chain" 105 as well as a local oscillator 106. When the cellular telephone is receiving, a high frequency RF signal 107 is received on antenna 102. Information from signal 107 passes through duplexer 108, matching network 109, and through the receive chain 105. Signal 107 is amplified by low noise amplifier (LNA) 110 and is down-converted in frequency by mixer 111. The resulting down-converted signal is filtered by baseband filter 112 and is passed to the digital baseband integrated circuit 104. An analog-to-digital converter 113 in the digital baseband integrated circuit 104 converts the signal into digital form and the resulting digital information is processed by digital circuitry in the digital baseband integrated circuit 104. The digital baseband integrated circuit 104 tunes the receiver by controlling the frequency of the local oscillator signal (LO1) supplied by local oscillator 106 to mixer 111.

If the cellular telephone is transmitting, then information to be transmitted is converted into analog form by a digital-to-analog converter 115 in the digital baseband integrated circuit 104 and is supplied to a "transmit chain" 116. Baseband filter 117 filters out noise due to the digital-to-analog conversion process. Mixer block 118 under control of local oscillator 119 then up-converts the signal into a high frequency signal. Driver amplifier 120 and an external power amplifier 121 amplify the high frequency signal to drive antenna 102 so that a high frequency RF signal 122 is transmitted from antenna 102. The digital baseband integrated circuit 104 tunes the transmitter by controlling the frequency of the local oscillator signal (LO2) supplied by local oscillator 119 to mixer 118.

Figure 4:
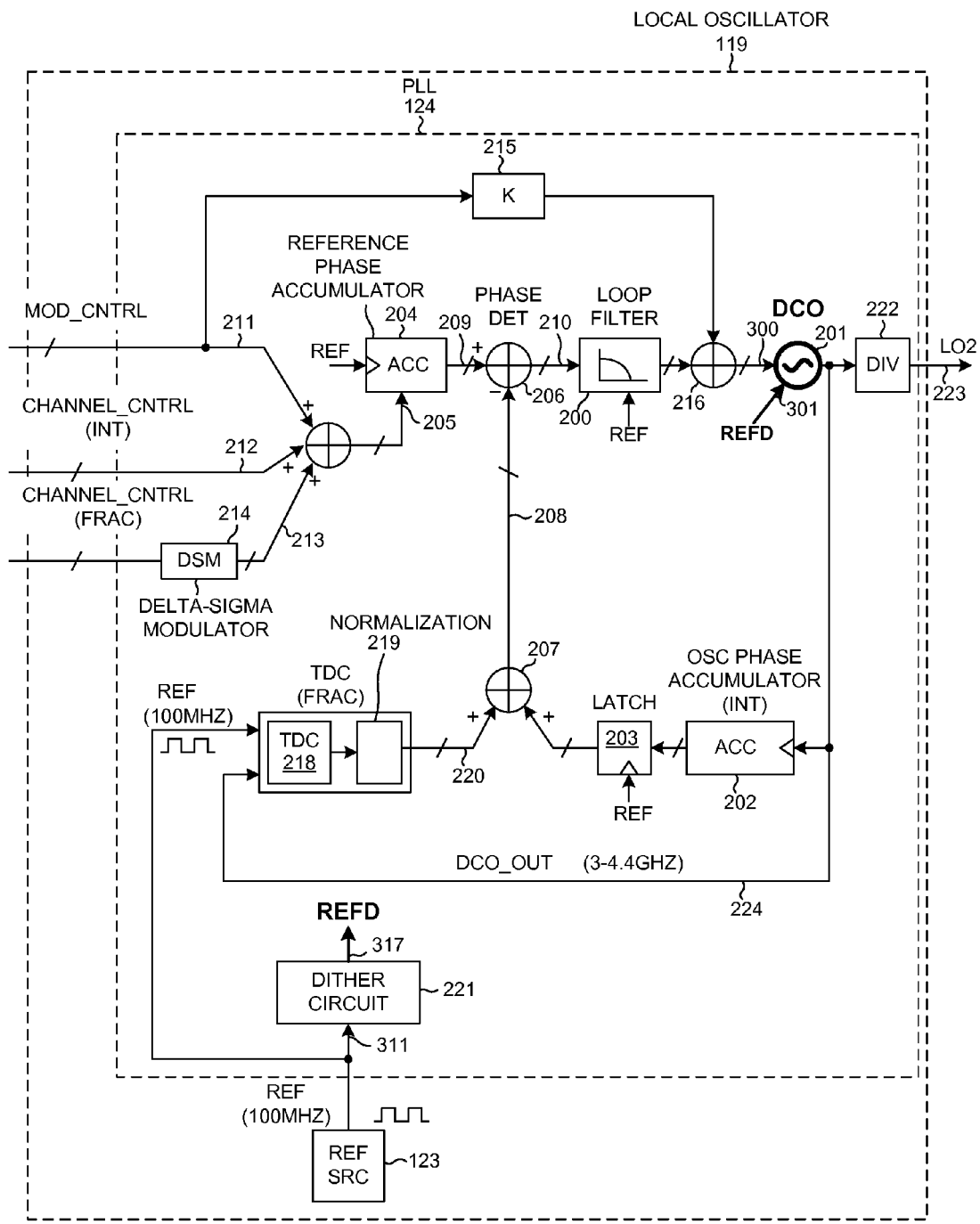
FIG. 4 is a more detailed diagram of local oscillator 119 of FIG. 3.

FIG. 4 is a more detailed diagram of local oscillator 119 of FIG. 3. Local oscillator 119 includes a reference clock signal source 123 and a time-to-digital converter all-digital phase-locked loop TDC ADPLL 124. In the present example, the reference clock signal source 123 is a connection to an external crystal oscillator module. Reference source 123 may, for example, be a signal conductor in this case. Alternatively, the reference clock signal source 123 is an oscillator disposed on RF transceiver integrated circuit 103, where the crystal is external to integrated circuit 103 but is attached to the oscillator via terminals of the integrated circuit 103.

PLL 124 includes a loop filter 200 that outputs a stream of digital tuning words. A Digitally Controlled Oscillator (DCO) 201 receives a digital tuning word and outputs a corresponding signal DCO_OUT whose frequency is determined by the digital tuning word. DCO_OUT may, for example, have a frequency in the range of three to four gigahertz. An accumulator 202 increments each period of DCO_OUT, and the accumulated value is latched into latch 203 synchronously with a reference clock signal REF. A reference phase accumulator 204 increments by a value on its input leads 205 synchronously with reference clock signal REF. The value accumulated in accumulator 204 is supplied via lines 209 to a subtractor 206. The output of an adder 207 is supplied via lines 208 to subtractor 206. Subtractor 206, which is also referred to as a phase detector, subtracts the value on lines 208 from the value on lines 209 and supplies the resulting error value in the form of a digital word on lines 210 to loop filter 200.

The value on input leads 205 by which accumulator 204 increments is the sum of a modulation frequency control value MOD_CNTRL on lines 211, a channel frequency control integer value CHANNEL_CNTRL (INT) on lines 212, and a channel frequency control fractional value CHANNEL_ CNTRL (FRAC) on lines 213. The fractional value is changed over time by a delta-sigma modulator 214. A two point modulation technique is used so the modulation frequency control value on lines 211 is scaled by block 215 and is input into the control loop at a second modulation point at adder 216. The value on lines 208 is the sum of an integer portion output by latch 203 as well as a fractional portion on lines 220. A time-to-digital converter 218 produces a digital output timestamp representing the time difference between an edge of the signal DCO_OUT and an edge of the reference clock signal REF. The signal REF has a fixed frequency (for example, 100 MHz) that is significantly lower than the frequency of DCO_OUT. The timestamps output by TDC 218 are normalized by a normalization circuit 219 to generate the fractional portion on lines 220. The control loop operates to keep the values on lines 209 and 208 locked to one another and substantially identical. The DCO_OUT signal that is output by DCO 201 is divided by a fixed divider 222 (for example, divide-by-four) to generate the local oscillator output signal LO2 on output conductor 223.

In accordance with one novel aspect, the discrete times at which DCO 201 changes the frequency of DCO_OUT are dithered. The term "dither" as it is used here does not refer to the changing of times when the DCO output frequency changes due to inherent noise being present in the clock signal supplied to DCO 201 (which would have only a relatively slight affect), but rather refers to more substantial and deliberately caused dithering. In the specific example illustrated in FIG. 4, a dither circuit 221 generates a dithered version of the reference clock signal REFD and supplies REFD to DCO 201. REFD has center frequency that is significantly lower frequency than DCO_OUT. REFD may, for example, have a center frequency of 100 megahertz whereas DCO_OUT may be in the range of from 3.0 to 4.4 gigahertz. The dither is ideally a continuously uniformly distributed (occurs with uniform probability) over one sample period. In the particular example illustrated here, this ideal continuously uniformly distributed dither is approximated with a discretely uniform dither distribution (such as the distribution generated by the circuits of FIGS. 6A and 6B below).

Figure 5:
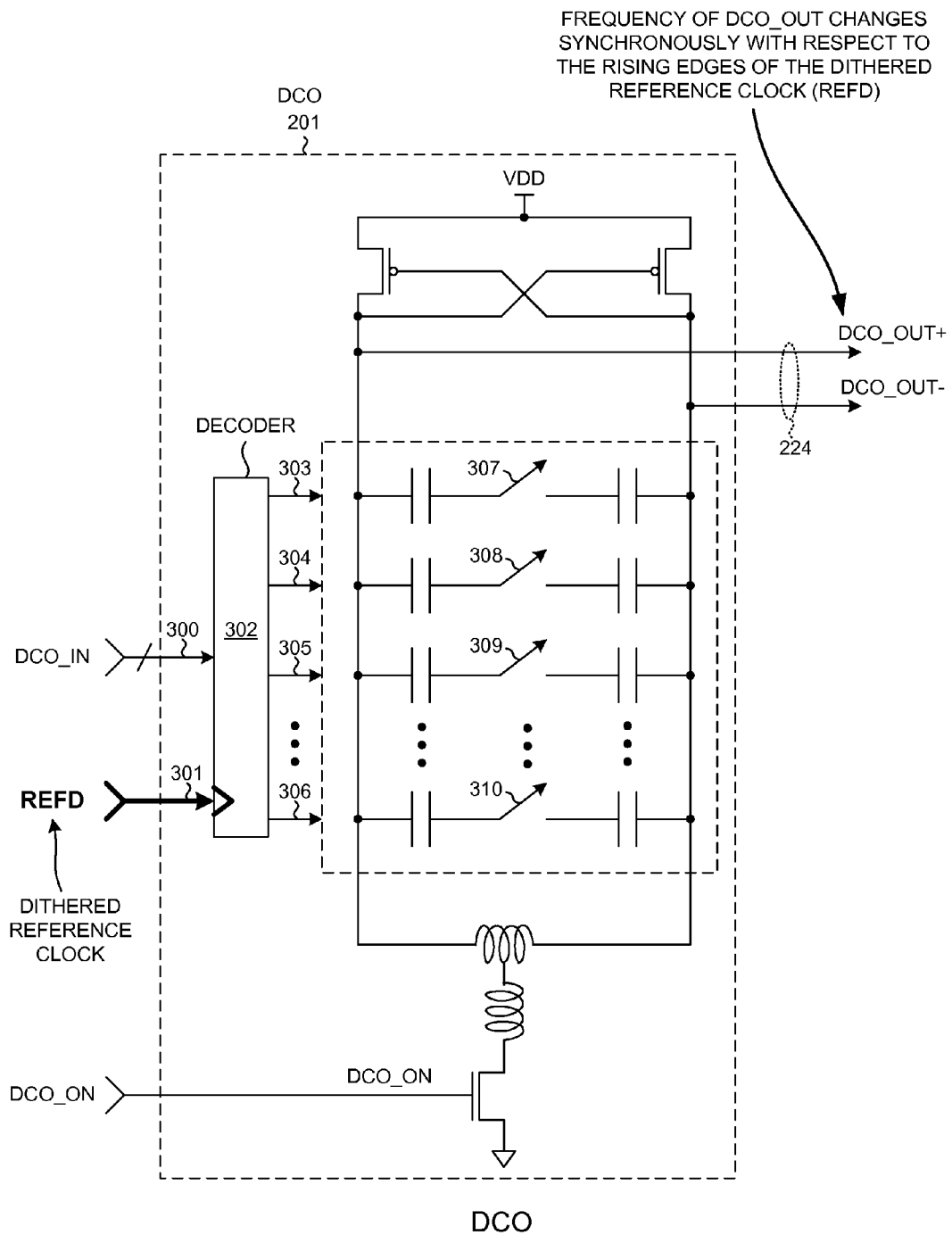
FIG. 5 is a diagram of one way to realize DCO 201 of FIG. 4.

FIG. 5 is a diagram of one way to realize DCO 201 of FIG. 4. A stream of undithered digital tuning words from adder 216 is received by DCO 221 via conductors 300. The dithered reference clock signal REFD is received by DCO 221 on conductor 301 from dither circuit 221. Decoder 302 decodes the digital tuning words into switch control signals. The switch control signals are then latched within decoder 302 so that the changes in the control signals as output by decoder 302 occur synchronously with respect to rising edges of REFD. The switch control signals are output onto corresponding output leads 303-306. Each one of the switch control signals controls a corresponding one of a set of switches 307-310. How many and which ones of the switches 307-310 are closed and open determines the resonant frequency of DCO 201 and therefore determines the frequency of the differential DCO_OUT signal. The single line 224 illustrated in FIG. 4 represents two conductors for communicating the differential pair of signals DCO_OUT+ and DCO_OUT- of FIG. 5.

Figure 6A:
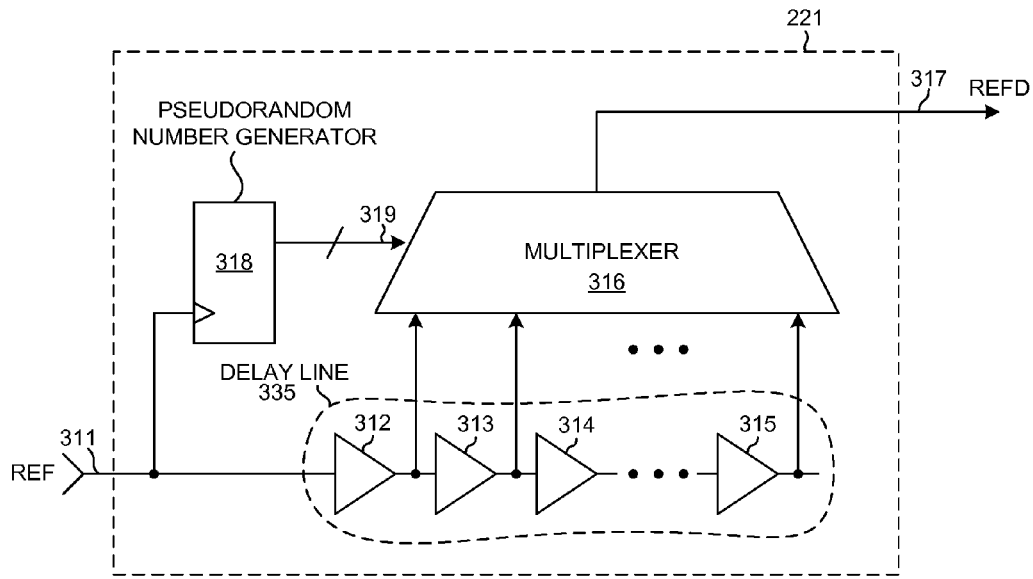
FIG. 6A is a first example of a way to realize dither circuit 221 of FIG. 4.

FIG. 6A is a first example of a way to realize dither circuit 221 of FIG. 4. The reference clock signal REF is received on conductor 311. A plurality of delayed versions of the undithered reference clock signal REF are generated in a delay line 335 made up of logic buffers 312-315. A digital multiplexer 316 selects one of the delayed versions of the reference clock REF from the delay line and supplies this selected delayed version onto an output conductor 317. A pseudorandom number generator 318 that is clocked by the reference clock signal REF outputs a multi-bit digital value that pseudorandomly changes from cycle to cycle of REF. This multi-bit digital value is supplied onto the select input leads 319 of multiplexer 316. As the value output by pseudorandom number generator 318 changes, the phase of the dithered reference clock signal REFD changes. This change in phase is referred to as dithering.

Figure 6B:
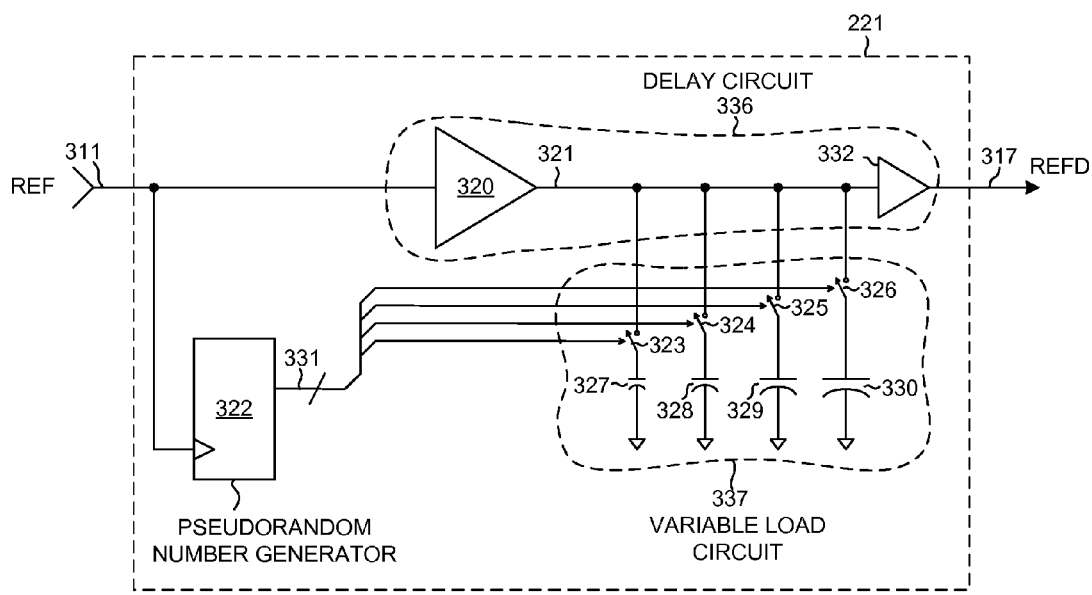
FIG. 6B is a second example of a way to realize dither circuit 221 of FIG. 4.

FIG. 6B is a second example of a way to realize dither circuit 221 of FIG. 4. The undithered reference clock signal REF is received on input conductor 311 and is delayed a varying amount by a delay circuit 336 involving a logic buffer 320. The propagation delay through buffer 320 depends upon the amount of capacitive loading on its output node 321. A pseudorandom number generator 322 and a variable load circuit 337 pseudorandomly change the capacitive loading on output node 321. Variable load circuit 337 involves a set of switches 323-326 and capacitors 327-330. The pseudorandom values output by pseudorandom number generator 322 onto conductors 331 determine which ones of the switches 323-326 are open and closed, and therefore determine the capacitive loading on output node 321. An output buffer 332 is provided to improve the signal edges of the variably delayed signal. The resulting dithered reference clock signal REFD is supplied onto output conductor 317. Switches 323-326 may be realized in numerous different ways. For example, each switch may be a single N-channel field effect transistor or may be a P-channel/N-channel field effect transistor pair (transfer gate) having complementary control lines. Pseudorandom number generator 322 can be implemented with a sigma-delta modulator having programmable parameters (e.g. the range of the dither can be programmable).

Figure 1:
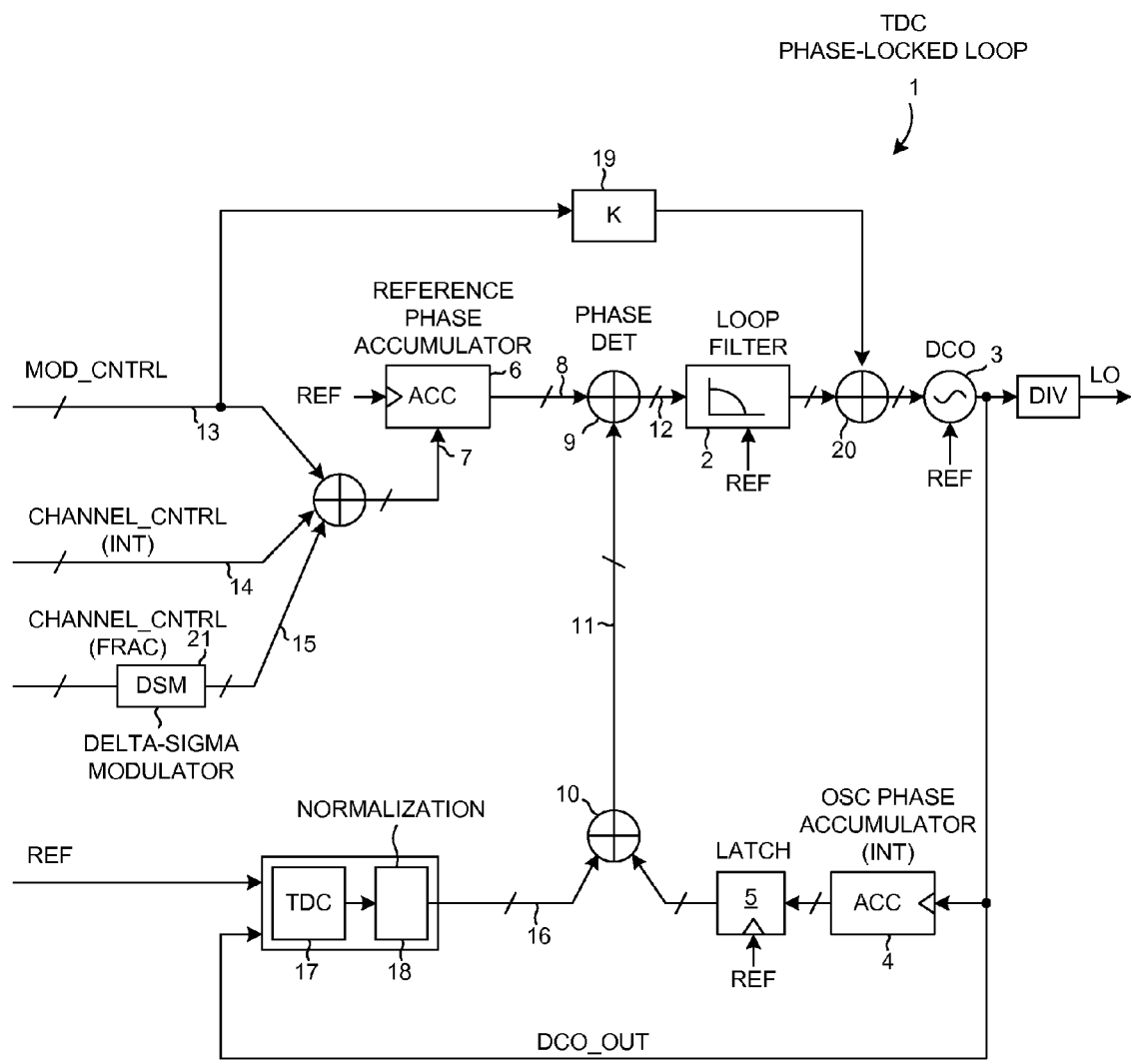
FIG. 1 (Prior Art) is a simplified block diagram of a conventional TDC PLL.
Figure 7:
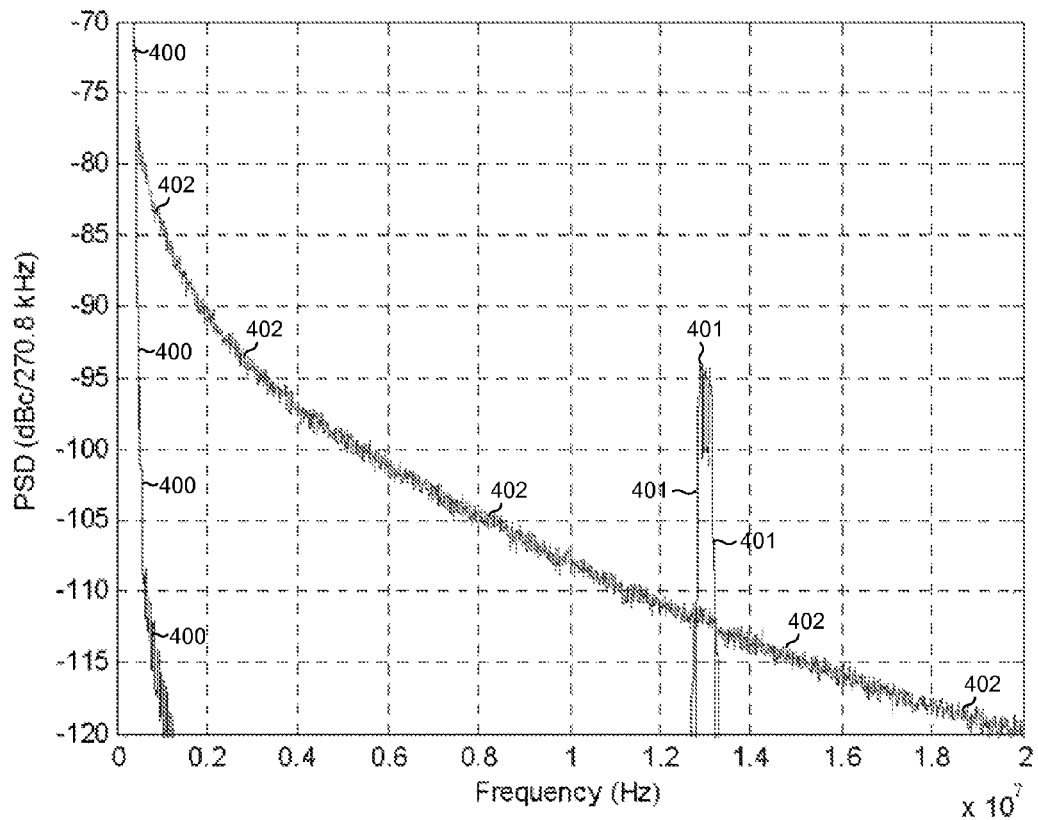
FIG. 7 is a chart that illustrates the power spectral density of the DCO output signal in a conventional TDC PLL and the power spectral density of the DCO_OUT signal in the novel PLL of FIG. 4.

FIG. 7 is a chart that illustrates the power spectral density of the DCO output signal in a conventional TDC PLL and the power spectral density of the DCO_OUT signal in the novel PLL of FIG. 4. The label PSD on the vertical axis refers to "Power Spectral Density". The frequency scale of the horizontal axis represents the offset, in frequency, relative to the DCO_OUT main frequency. Accordingly, the "0" at the left of the horizontal scale identifies the main frequency of the DCO_OUT signal. The line at the left of the chart labeled 400 identifies the main spectral component of the DCO_OUT signal. The peak labeled 401 represents digital image noise present in the DCO_OUT signal in the conventional PLL of FIG. 1. Note that a significant amount of power is present at a particular frequency offset from the main frequency of DCO_OUT. The magnitude of noise at this particular frequency offset may be so great that the cellular telephone specification that sets a maximum amount of phase noise at each frequency is violated.

Line 402, on the other hand, represents spreading of the energy of the digital image noise out in frequency in accordance with one novel aspect. This spreading is due to the dithering of the times at which the frequency of DCO_OUT changes. The dithering is ideally discrete uniform dithering using sixteen values equally spread over one sample period. The sampling frequency is 13 MHz. At each discrete frequency offset, there is a maximum permitted amount of energy allowed according to the cellular telephone specification. This permitted amount of energy-to-frequency offset relationship is referred to as a mask. Line 402 falls within the mask. ADPLL 124 therefore satisfies the noise specification. In the case of the cellular telephone standard being GSM, the ORFS specification for noise is satisfied by appropriate dithering of the reference clock signal supplied to DCO 201. The noise 402 is rejected by the loop at frequencies within the loop bandwidth and thus the integrated phase noise (the sum of the noise within the wanted signal bandwidth) is controlled using the loop bandwidth. Spreading digital image noise out in frequency as illustrated in FIG. 7 allows noise specifications to be met without having to increase the frequency of the PLL reference clock. By avoiding increasing the frequency of the reference clock to meet a noise specification, increases in power consumption that otherwise might be required to meet the noise specification can be avoided.

Figure 8A:
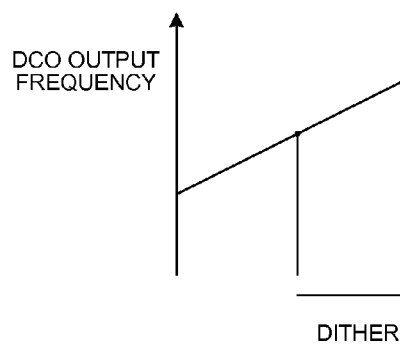
FIGS. 8A and 8B illustrate two ways that DCO 201 can be dithered. In the example of FIG. 8B, the DCO output frequency is compensated to match the dither as illustrated.
Figure 8B:
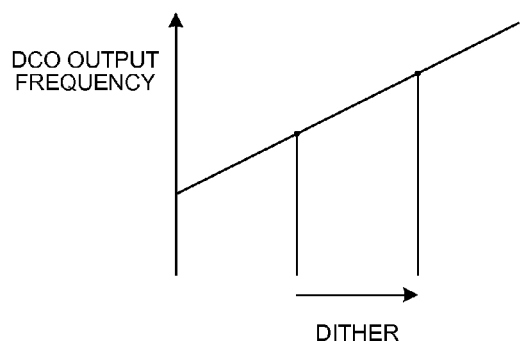

FIG. 8A illustrates how the DCO frequency is received at the regular sample time and is clocked out at some other dithered time. This illustrates the dithering described above. Another type of dithering, however, can be employed as illustrated in FIG. 8B. In the example of FIG. 8B, the DCO output frequency corresponds to the new (dithered) sample time. The DCO output frequency is compensated to match the dither.

Figure 9:
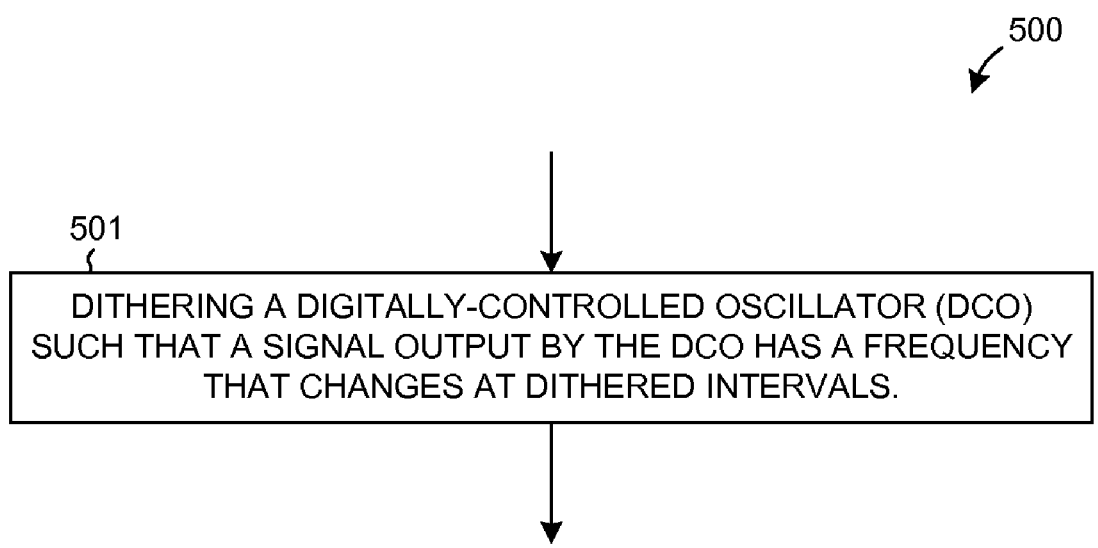
FIG. 9 is a flowchart of a method in accordance with one novel aspect.

FIG. 9 is a flowchart of a single step method 500 in accordance with one novel aspect. In step 501, the DCO of a PLL is dithered such that a signal output by the DCO (for example, signal DCO_OUT in FIG. 4) has a frequency that changes at dithered intervals. Such dithering may accomplish the spreading of digital noise energy out over frequency as illustrated in FIG. 7.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. Execution of a set of instructions stored in a computer-readable medium in the digital baseband IC 104 may, in some embodiments, cause information to be communicated to RF transceiver IC 103 such that the type of DCO dithering is changed or such that DCO dithering is started or stopped. The dithering can be performed in a selected one of a plurality of different ways and the selected type of dithering can be changed (for example, under software or firmware control) under software control depending on an operating mode of the cellular telephone.

Although certain specific embodiments are described above for instructional purposes, the teachings of this patent document have general applicability and are not limited to the specific embodiments described above. Although specific circuitry is described that supplies a dithered clock signal to a DCO such that digital tuning words received into the DCO are undithered and such that the changes in DCO output signal frequency are dithered, other embodiments include embodiments in which the clock signal supplied to the loop filter is dithered so that the stream of digital tuning words supplied to the DCO is dithered. In the case of the stream of incoming digital tuning words being dithered, the DCO output signal can be dithered without having to latch the switch control signals from decoder 302 in FIG. 5. Alternatively, both the loop filter and the DCO may be clocked by the same dithered reference clock signal. In both cases, however, the frequency changes in the DCO output signal are dithered. Accordingly, various modifications, adaptations, and combinations of the various features of the described specific embodiments can be practiced without departing from the scope of the claims that are set forth below.

What is claimed is:

1. A method for generating a digitally controlled oscillator (DCO) signal output at a frequency that changes at dithered intervals, comprising:
   generating a dithered clock signal comprising:
      receiving an undithered reference clock signal in a first buffer; and
      applying a pseudo-random number generator to a first set of switches to vary the amount of analog capacitive loading on an output of the first buffer over time, wherein the dithered clock signal has a center frequency that is significantly lower frequency than the DCO signal output;
   receiving the dithered clock signal at the DCO;
   receiving an undithered stream of digital tuning words at the DCO;
   dithering the undithered stream of digital tuning words by decoding the undithered stream of digital tuning words into switch control signals and latching the decoded switch control signals coincidentally with a rising edge of the dithered clock signal; and
   outputting the decoded switch control signals to selectively open and close a second set of switches which determine the resonant frequency of the DCO signal output.

2. The method of claim 1, further comprising:
   using the signal output by the DCO in a phase-locked loop.

3. The method of claim 1, wherein the frequency of the signal output by the DCO changes at substantially discrete times, and wherein time intervals between at least some successive ones of the discrete times are different.

4. The method of claim 1, further comprising:
   supplying a reference clock to a time-to-digital converter (TDC) of a phase-locked loop (PLL); and
   supplying the signal output of the DCO to the TDC.

5. The method of claim 1, further comprising:
   buffering the dithered clock signal in a second buffer to improve the dithered clock signal edges.

6. A phase-locked loop (PLL) comprising:
   a digitally-controlled oscillator (DCO) that receives an undithered stream of digital tuning words and a dithered clock signal and outputs a DCO output signal, wherein the DCO output signal has a frequency that changes at dithered intervals, said DCO comprising:
      a decoder; and
      a first plurality of switches, wherein the decoder decodes the undithered stream of digital tuning words into switch control signals and latches the decoded switch control signals coincidentally with a rising edge of the dithered clock signal, and wherein the frequency of the DCO output is determined by which of the first plurality of switches is open and closed; and
   a dither circuit that receives an undithered reference clock signal and generates therefrom and outputs the dithered clock signal having a center frequency that is significantly lower frequency than the DCO signal output, the dither circuit comprising:
      a second plurality of switches;
      a digital number generator coupled to each of the second plurality of switches to randomly open and close each of the plurality of switches; and
      a plurality of capacitors each respectively coupled to one of the second plurality of switches such that as each of the second plurality of switches is opened and closed, the analog capacitive loading on an output line is varied resulting in a variably delayed output signal.

7. A phase-locked loop (PLL), comprising:
   means for generating a dithered clock signal comprising:
      means for receiving an undithered reference clock signal in a first buffer; and
      means for applying a pseudo-random number generator to a first set of switches to vary the amount of analog capacitive loading on an output of the first buffer over time, wherein the dithered clock signal has a center frequency that is significantly lower frequency than a DCO signal output;
   means for receiving the dithered clock signal at a digitally controlled oscillator (DCO);
   means for receiving an undithered stream of digital tuning words at the DCO;
   means for dithering the undithered stream of digital tuning words by decoding the undithered stream of digital tuning words into switch control signals and latching the decoded switch control signals coincidentally with a rising edge of the dithered clock signal; and
   means for outputting the decoded switch control signals to selectively open and close a second set of switches which determine the resonant frequency of the DCO signal output that changes at dithered intervals.

8. The phase-locked loop of claim 7, further comprising:
   means for using the signal output by the DCO in a phase-locked loop.

9. The phase-locked loop of claim 7, wherein the frequency of the signal output by the DCO changes at substantially discrete times, and wherein time intervals between at least some successive ones of the discrete times are different.

10. The phase-locked loop of claim 7, further comprising:
means for receiving a reference clock at a time-to-digital converter (TDC); and
means for supplying the signal output of the DCO to the TDC.

11. The phase-locked loop of claim 7, further comprising:
means for buffering the dithered clock signal to improve dithered clock signal edges.

12. A phase-locked loop (PLL) comprising:
a digitally-controlled oscillator (DCO) that receives an undithered stream of digital tuning words and a dithered clock signal and outputs a DCO output signal, wherein the DCO output signal has a frequency that changes at dithered intervals, said DCO comprising:
  a decoder; and
  a first plurality of switches, wherein the decoder decodes the undithered stream of digital tuning words into switch control signals and latches the decoded switch control signals coincidentally with a rising edge of the dithered clock signal, and wherein the frequency of the DCO output is determined by which of the first plurality of switches is open and closed; and
a dither circuit that receives an undithered reference clock signal and generates therefrom an output dithered clock signal having a center frequency that is significantly lower in frequency than the DCO signal output, wherein the undithered reference clock signal used to generate the dithered clock signal is also significantly lower in frequency than the DCO signal output, and wherein the dither circuit comprises a plurality of analog capacitors configured to vary the capacitive loading on an output line to generate a variably delayed output signal.

* * * * *